US006483118B2

(12) United States Patent
Fujiwara et al.

(10) Patent No.: US 6,483,118 B2
(45) Date of Patent: Nov. 19, 2002

(54) POSITRON SOURCE, METHOD OF PREPARING THE SAME, AND AUTOMATED SYSTEM FOR SUPPLYING THE SAME

(75) Inventors: Ichiro Fujiwara, Osaka (JP); Yoshiko Ito, Saitama (JP); Ren Iwata, Miyagi (JP); Toshio Hyodo, Tokyo (JP); Yasushige Yano, Saitama (JP); Akira Goto, Saitama (JP); Yuji Ikegami, Saitama (JP); Yoshio Nomiya, Saitama (JP)

(73) Assignee: Riken, Saitama (JP)

( * ) Notice: Subject to any disclaimer, the term of this patent is extended or adjusted under 35 U.S.C. 154(b) by 0 days.

(21) Appl. No.: 09/908,158

(22) Filed: Jul. 19, 2001

(65) Prior Publication Data

US 2001/0040223 A1 Nov. 15, 2001

Related U.S. Application Data

(62) Division of application No. 09/388,060, filed on Sep. 1, 1999.

(30) Foreign Application Priority Data

Sep. 2, 1998 (JP) .......................................... 10-248611
Oct. 29, 1998 (JP) .......................................... 10-308533

(51) Int. Cl.[7] .............................................. H01J 37/252
(52) U.S. Cl. ............................... 250/423 R; 313/359.1
(58) Field of Search ................... 250/423 R; 313/359.1

(56) References Cited

U.S. PATENT DOCUMENTS

2002/0030160 A1 * 3/2002 Greaves ...................... 250/308

* cited by examiner

*Primary Examiner*—Bruce Anderson
*Assistant Examiner*—Zia R. Hashmi
(74) *Attorney, Agent, or Firm*—Rosenthal & Osha L.L.P.

(57) ABSTRACT

The present invention provides a positron source essentially consisting of a carbon member having $^{18}F$ bound onto the surface thereof, a method of a preparing the same, and an automated system for supplying the same. In the present invention, the positron source is prepared by irradiating a solution 35 containing both $H_2{}^{18}O$ and a small amount of natural fluorine ions with a beam of charged particles to generate $^{18}F$, and then passing an electric current through the solution 35 using a carbon member 40 as an anode to cause to bind the generated $^{18}F$ onto the surface of the carbon member 40.

5 Claims, 7 Drawing Sheets

Time course of binding efficiency (Carbon 3 mm $\phi$)

POSITRON SOURCE, METHOD OF PREPARING THE SAME, AND AUTOMATED SYSTEM FOR SUPPLYING THE SAME

This application is a divisional application based on U.S. patent application No. 09/388,060, filed Sep. 1, 1999.

FIELD OF THE INVENTION

The present invention relates to a positron source capable of generating a positron beam of high intensity, a method of preparing the positron source, and an automated system for supplying the positron source.

RELATED BACKGROUND ART

Slow positron beams have been commonly used in positron microscopes, for research in physical properties and for crystal defect evaluation of the surfaces or interfaces of semiconductors and metallic materials, and recently have become useful more and more. At present, slow positron beams are generated by emitting from positron emitters (radioisotopes), or by ejecting positrons that are generated through pair creation with a braking radiation into a moderate to be slowed down the positrons. A positron emitter is often prepared by irradiating a solid target (e.g., aluminum or boron nitride) with a beam of charged particles (e.g., protons) accelerated with a cyclotron or the like; thus a positron emitter can be generated in the solid target. A braking radiation is usually generated by irradiating a heavy metal target with an electron beam accelerated with a linear accelerator or the like.

Upon the utilization of positron beams, a strong point source for a positron emitter is required. Various approaches have been proposed for increasing the intensity of positron beams, such as the improvement in moderate efficiency and the use of a stronger positron source. As a moderate, one formed of a tungsten foil which is annealed at 2000° C. is currently used. However, such moderate cannot achieve an efficiency of the order of $10^{-4}$ or more. Although many efforts are being made to improve moderators, drastic and practical improvements could hardly be expected. On the other hand, for preparing a strong positron source, the use of a large-scale and expensive device is needed.

In the preparation process for a strong positron source using a solid target, there is a serious problem that heat generated during the passage of a large electric current should be removed. The process also has another problem as follows. A solid target is placed nearby a moderator for the purpose of causing to emit positrons from a positron emitter generated in the target and increasing the incident efficiency of positrons generated through pair creation with a braking radiation into the moderator. When such solid target is irradiated with an electron beam or an ion beam, the moderator sustains a radiation damage or is radioactivated by a secondary radiation other than the positrons. In order to overcome this problem, it is proposed an approach for avoiding the influence of the secondary radiation during the irradiation of the target, which comprises: irradiating a solid target at a place a distance away from a moderator thereby generating a positron emitter; transferring the irradiated solid target to the place where the moderator is placed; and ejecting a beam of positrons emitted from the positron emitter in the solid target into the moderator. However, such approach is not practical. This is because the use of a solid target usually needs a cooling device for removing heat generated as a result of the irradiation and, therefore, if a solid target is to be transferred, the system as a whole will inevitably become a large scale due to the integration of the cooling device. In the process utilizing a braking radiation generated with an electron beam, it is impossible in principle to separate a heavy metal target and a moderator. Moreover, in this process, it is necessary to automate the supply of a positron source to a positron beam-generating unit for the purpose of avoiding the harmful irradiation exposure of operators.

SUMMARY OF THE INVENTION

Under these situations, the present invention is made. That is, the object of the present invention is to provide a positron source capable of generating a positron beam of high intensity without damaging a moderator, a method of preparing the positron source, and an automated system for supplying the positron source.

The present inventors have found that the positron source can be prepared using a liquid target containing $H_2{}^{18}O$ [$^{18}O(H_2O)$] as a target for generating a positron emitter, by irradiating the liquid target with a proton beam to generate a positron emitter $^{18}F$ through a $^{18}O(p,n)^{18}F$ reaction, and causing to bind the $^{18}F$ onto a carbon member to trap the $^{18}F$ on the carbon member. This finding leads the accomplishment of the present invention.

Therefore, the present invention provides a positron source comprising a carbon member having $^{18}F$ bound onto the surface thereof. The carbon member is preferably made of graphite or glassy carbon. The carbon member preferably has a rod-like or strip-like geometry onto an end of which $^{18}F$ is bound.

The present invention also provides a method of preparing a positron source comprising: irradiating a liquid target containing $H_2{}^{18}O$ with a beam of charged particles to generate $^{18}F$; and passing an electric current through the liquid target using a carbon member as an anode to cause to bind the $^{18}F$ onto the surface of the carbon member. The liquid target may contain a small amount of natural fluorine ions, for example, by the addition of a fluoride of an alkali metal which is soluble in the liquid target and is a strong electrolyte (e.g., NaF, $NaHF_2$ and KF).

The reason for the pre-addition of a small amount of natural fluorine ions to a liquid target [$^{18}O(H_2O)$] is as follows. The number of the $^{18}F$ atoms generated through a nuclear reaction in the liquid target is at most $3.5\times10^{15}$ atoms, which corresponds to only $1.1\times10^{-8}$ g in terms of the weight of fluorine atoms. Such extremely trace amount of $^{18}F$ atoms might result in insufficient current for electrodeposition. In order to prevent this problem, natural fluorine ions are added to the liquid target at a concentration of 2 $\mu$g/ml so that the number of the $^{18}F$ atoms becomes about 100 times greater than that without natural fluorine ions. This ensures the chemical behavior of the generated $^{18}F$ as $F^-$ in an aqueous solution (a liquid target). Since the amount of the fluorine ions added is very small, it is necessary for the fluorine ions to be added to the liquid target prior to the irradiation.

In the present invention, it is preferable that the carbon member (i.e., an anode) have a rod-like or strip-like geometry and an electric current be passed through the liquid target while contacting an end surface of the carbon member with the liquid target so that the $^{18}F$ is concentratedly bound onto the end surface of the carbon member. It has not been made clear yet whether the bonding of the $^{18}F$ onto the surface of the carbon member is via a direct bonding between the $^{18}F$ and a carbon atom in the carbon member (e.g., generation of a C-F bonding) or via intercalation of the $^{18}F$ into a graphite-type crystal structure of the carbon member (i.e., formation of an intercalation compound).

The present invention also provides an automated system for supplying a positron source comprising: means for moving a container with a solution containing $^{18}F$ to the position where an electric current is to be passed through the solution; means for passing an electric current through the solution at that position using a carbon member as an anode; and means for transferring the carbon member after the passage of the electric current to a positron beam-generating unit. In this system, the solution containing $^{16}F$ is fed to a container placed in another room, and an electric current is then passed through the solution at that place. This system may further comprise means for recovering the solution after the passage of electric current.

The present invention further provides an automated system for supplying a positron source comprising: a rotary table for rotating a container mounted thereon; means for supplying a solution containing $^{18}F$ into the container; first drive means for rotationally driving the rotary table so that the container moves between the position where the solution is to be supplied into the container and the position where an electric current is to be passed through the solution in the container; a rotary member on which a carbon member is mounted; second drive means for rotationally driving the rotary member so that the carbon member moves between the position opposed to the liquid surface of the solution in the container placed in the position where an electric current is to be passed to the solution and the position opposed to a positron source-receiving section of a positron beam-generating unit; hoisting-and-lowering means for moving the rotary member up and down; and a power supply for passing an electric current through the solution in the container using the carbon member as an anode; wherein the carbon member onto the surface of which $^{18}F$ is caused to bind by passing an electric current through the solution in the container using the carbon member as an anode, is attached to the positron source-receiving section of the positron beam-generating unit.

This system may further comprise contact-detection means for detecting the contact of the carbon member with the solution in the container, which enables a precise control of the depth of the carbon member immersed in the solution. The contact-detection means may also be serve as means for detecting a micro-current passing through the solution at the instant when the carbon member is contact with the liquid surface of the solution. In the system, a plurality of containers may be mounted on the rotary table and the same numbers of carbon members as that of the containers may be mounted on the rotary member so that a continuous operation becomes possible for a long time of period.

The $H_2{}^{18}O$-containing liquid target can be fed to any place readily through a pipe. Therefore, if it is possible to irradiate the $H_2{}^{18}O$-containing liquid target to generate a positron emitter $^{18}F$, transfer the $^{18}F$-containing solution by remote control to the place where the positrons are used, and trap the $^{18}F$ on the carbon member at that place in the state that the $^{18}F$ binds onto a very small area of the carbon member, then undesirable damage of a moderator or background noise of the measurements caused by the secondary radiation during the irradiation of the liquid target can be prevented by transferring only the carbon member (i.e., the positron source) to the place where the moderator is set. In addition, by confining the surface area of the carbon source onto which the positron emitter $^{18}F$ is intended to be bound within narrow limits, the density of the positron source in the surface area can be increased and, consequently, a positron beam of high intensity can be generated. According to the present invention, since the irradiation of the target is performed at a place a distance away from the moderator, the influence of the secondary radiation caused by the irradiation can be eliminated.

In the present invention, it is also preferable to immediately recover the $H_2{}^{18}O$ remaining in the solution after the preparation of a positron source is completed, because $H_2{}^{18}O$ is a very expensive material and the amount of $^{18}O$ converted into $^{18}F$ in one irradiation is extremely small. If the $H_2{}^{18}O$ is not recovered immediately and allowed to leave in the solution, it is not only evaporated as water vapor, but also normal water is dissolved into the $H_2{}^{18}O$-containing solution to reduce the concentration of the $H_2{}^{18}O$.

This specification includes part or all of the contents as disclosed in the specifications and/or drawings of Japanese Application Nos. 10-248611 and 10-308533, which are priority documents of the present application and incorporated herein by reference in their entirety.

The above and other objects, effects, features and advantages of the present invention will become more apparent from the following description of embodiments thereof taken in conjunction with the accompanying drawings.

DETAILED DESCRIPTION OF THE INVENTION

The present invention will be described in detail with reference to the drawings attached.

Figure 1:
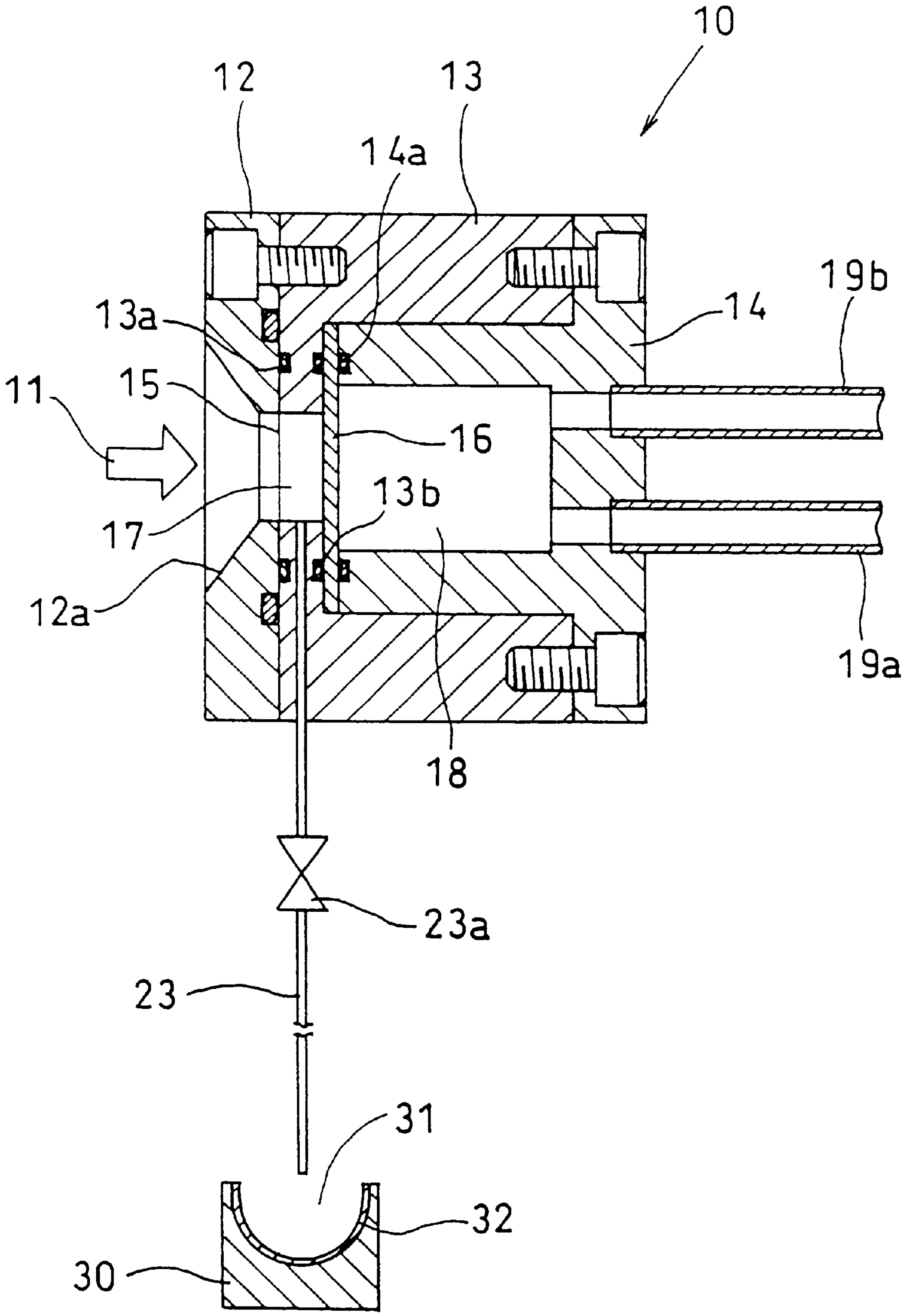
FIG. 1 is a schematic sectional view of an embodiment of a positron emitter-generating unit in accordance with the present invention.

Referring to FIG. 1, there is a schematic sectional view of a positron emitter-generating unit for generating a positron emitter (radioisotope) in a liquid target by irradiating a liquid target with a beam of charged particles. The positron emitter-generating unit 10 is composed of three blocks, an upper block 12 and an intermediate block 13 both having a through hole through the blocks 12 and 13 and a lower block 13 with a concave part 18. These three blocks are secured to one another by screws with the alignment of the through holes and the concave part 18 being made sure. In the intermediate block 13, the upper and lower openings of the through hole are sealed with a metal foil 15 (e.g., a titanium foil) and 16 (e.g., a silver foil), respectively, to form a space 17 for containing a liquid target (i.e., a liquid target container). O-rings 13*a*, 13*b* and 14*a* are provided to seal between the blocks 12, 13 and 14.

A charged particle beam 11 enters an opening 12*a* of the upper block 12 and passes through the metal foil 15 (e.g., a titanium foil) and applied to the liquid target in the container 17. The concave part 18 of the lower block 14 is provided with cooling water feed pipes 19*a* and 19*b* connected thereto, so that the target solution heated by the irradiation with the charged particle beam 11 is cooled down with the cooling water in the concave part 18 fed through the pipes 19*a* and 19*b*. To the container 17 are connected a liquid target feed pipe 23 shown in FIG. 1, a liquid target feed pipe (not shown) which is connected to the container 17 in a direction perpendicular to the plane of the sheet of FIG. 1, and a gas feed pipe (not shown) for introducing a $N_2$ gas into the container 17.

In the positron emitter-generating unit 10, a valve 23*a* is closed to store the liquid target in the container 17. In the container 17, the liquid target is irradiated with the charged particle beam 11, whereby a positron emitter is generated in the liquid target. In this embodiment, water containing $H_2{}^{18}O$ and 2 ppm of NaF is used as the liquid target, and $H_2{}^{18}O$ in the container 17 is irradiated with a proton beam (i.e., the charged particle beam 11) accelerated to an energy level of 16 MeV with an accelerator, thereby generating $^{18}F$ through a $^{18}O(p,n)$ $^{18}F$ reaction. The irradiation with the proton beam 11 is performed, for example, for 30 minutes. Thereafter, the valve 23*a* is opened, and $N_2$ gas is introduced into the container 17 through the gas feed pipe, whereby the $^{18}F$-containing $H_2{}^{18}O$ in the container 17 is transferred into a container 30 placed in another room. The container 30 is formed of a copper block with a semispherical cavity 31 on the inner surface of which rhodium plating 32 is applied.

Figure 2:
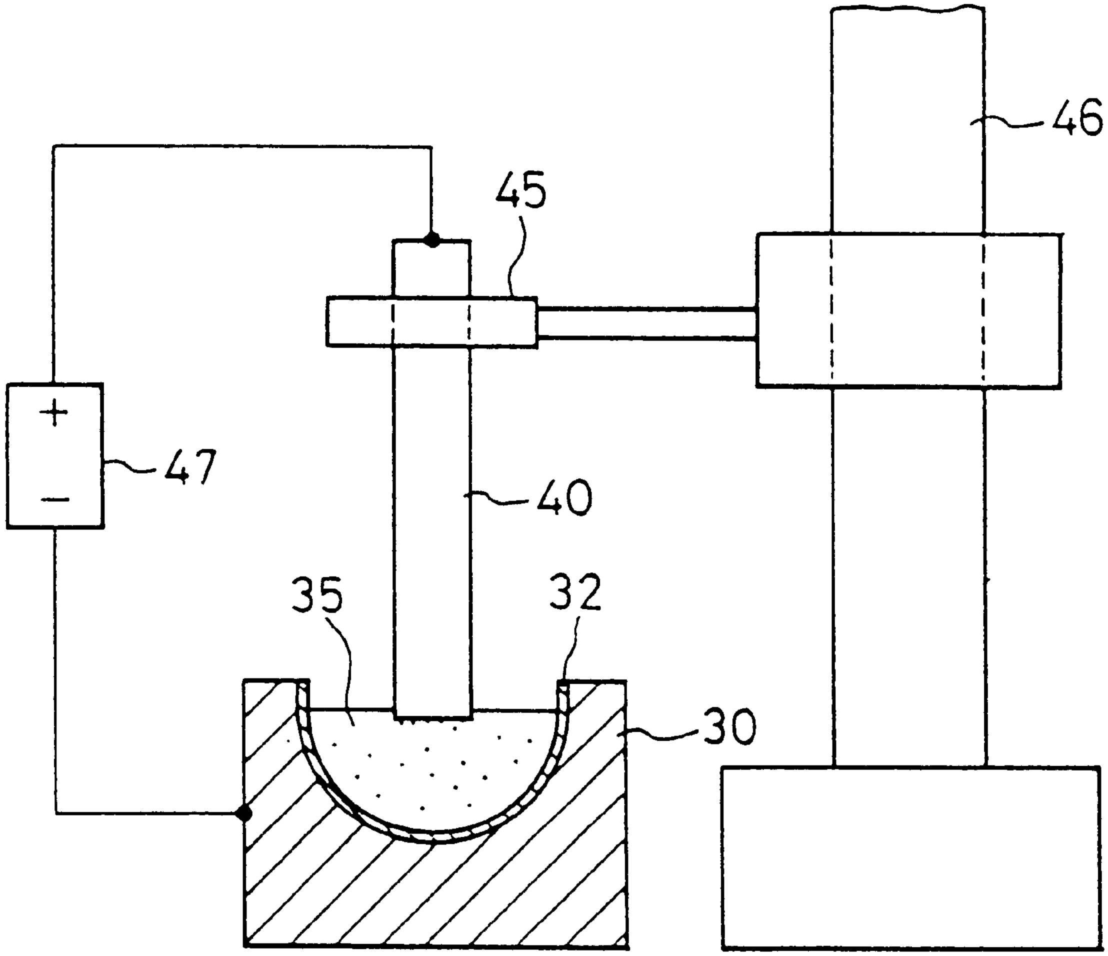
FIG. 2 is a partially sectional view illustrating the process of preparing a positron source in accordance with the present invention.

Referring to FIG. 2, there is a partially sectional view illustrating the process of preparing a positron source by causing to bind the positron emitter $^{18}F$ contained in the liquid target 35 in the container 30 onto an end surface of the carbon member. The container 30 contains a solution 35 containing both $^{18}F$ and 2 ppm of NaF which has been subjected to irradiation with the proton beam. The upper end of the carbon member 40 is held to a stand 46 by a plastic-made insulating holder 45. The carbon member 40 and the container 30 are connected to a constant-voltage power supply 47 so that the carbon member 40 is located on an anode side and the container 30 is located on a cathode side. It is preferably for the carbon member 40 to pass an electric current in the state that the bottom-surface of the carbon member 40 is contacted with the solution 35 with the smallest possible surface contact area so that $^{18}F$ is mostly bound to the bottom surface of the carbon member 40 and is bound to the side surface of the carbon member 40 as small as possible.

Therefore, for instance, the carbon member 40 is first located above the liquid surface of the solution 35 in the container 30 and then lifted down slowly toward the liquid surface of the solution 35. When the contact of the bottom surface of the carbon member 40 with the liquid surface of the solution 35 is confirmed by the detection of the flow of electricity from the constant-voltage power supply 47, the carbon member 40 is further lifted down (for example by 0.1 mm), and then held to the stand 46. Thus, the bottom surface of the carbon member 40 is ensured to contact with the solution 35 while maintaining the smallest possible contact area. When an electric current from the constant-voltage power supply is passed through the carbon member 40 contacting with the solution 35, $^{18}F$ in the solution 35 is concentrated near the carbon member 40 (an anode) and bound onto the carbon member 40. Thus, a positron source with a $^{18}F$(positron emitter)—rich end surface can be prepared.

Figure 3A:
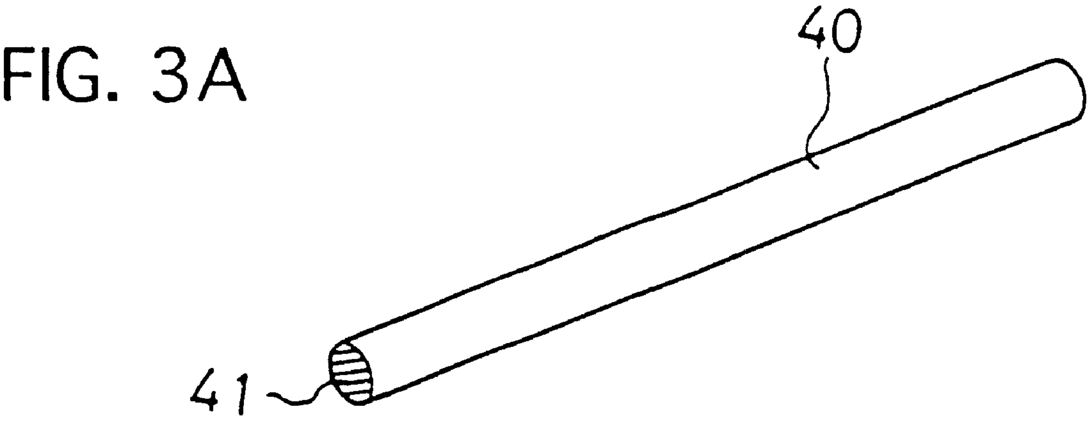
FIG. 3A is a schematic view of an embodiment of a positron source in accordance with the present invention.
Figure 3B:
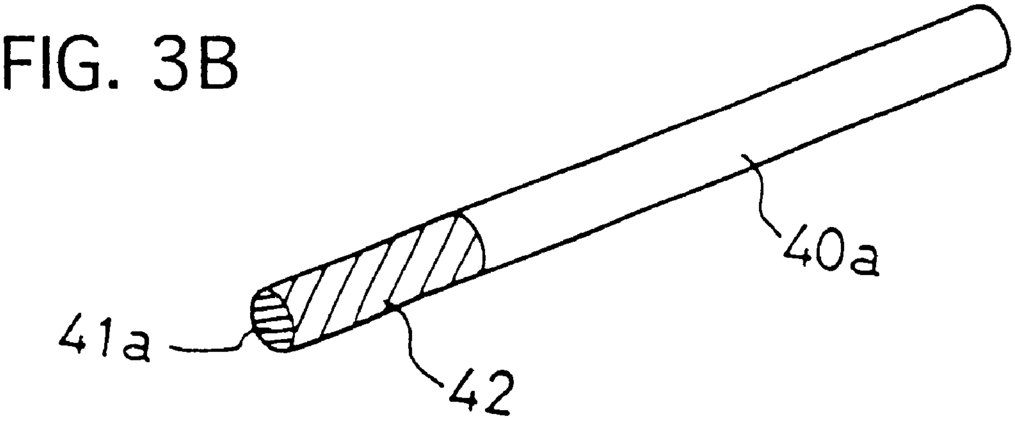
FIG. 3B is a schematic view of an alternative embodiment of a positron source in accordance with the present invention.

Referring to FIG. 3A and 3B, there are schematic views of embodiments of a positron source according to the present invention. FIG. 3A shows a positron source prepared by the process illustrated in FIG. 2. In the positron source of FIG. 3A, a positron emitter $^{18}F$ is bound onto one end surface 41 of a fine cylindrical carbon member 40 in a high density. FIG. 3B shows an alternative embodiment of a positron source of the present invention, in which a fine cylindrical positron source 40*a* is applied with an insulating coating 42 at a part of the side surface near its one end. The application of the insulating coating 42 serves to prevent the bonding of the positron emitter $^{18}F$ onto the side surface of the carbon member 40 even when the carbon member 40 is immersed in the solution 35 relatively deeply upon the passage of electric current in the process as shown in FIG. 2. Thus, the $^{18}F$ binds onto the end surface 41*a* exclusively.

In the positron source according to the present invention, a positron emitter $^{18}F$ binds uniformly onto an end surface 41 or 41*a* of the carbon member 40 or 40*a*, respectively, without any carrier and the thickness of the positron emitter $^{18}F$ bound onto the end surface is negligible. Therefore, the positron from the positron emitter $^{18}F$ can be emitted from the small surface area of the carbon member 40 (which is almost a point source) efficiently without any influence of scattering or absorbance.

Then, the binding efficiency of the positron emitter $^{18}F$ onto the carbon member is examined. Water (1 ml) containing $H_2{}^{18}O$ (purity: 90%) and 2 $\mu$g of NaF is used as a liquid target. The liquid target is irradiated with a proton beam which is accelerated to an energy level of 16 MeV. After the irradiation, the liquid target is transferred to a semispherical container (void volume: 1 ml) of 8 mm in radius as shown in FIG. 2 and a carbon member 40 is set as shown in FIG. 2. The carbon member 40 used is a graphite rod which is prepared by working a high-purity graphite for spectrometry purpose into a cylindrical rod of 5 mm or 3 mm in diameter and 3 cm in length. The graphite rod is provided with a copper terminal on one end, and the other end is polished to give a smooth surface. The graphite rod is mounted to a plastic holder 45 and arranged so that the center of the end surface is aligned with the center of the container 30, and then connected to a constant-voltage power supply 47 to pass electric current. The voltage applied is varied from 70V to 180V in 10V intervals and the period of time for passing electric current is set at 5, 10 and 20 minutes. The intensity of the gamma ray of 0.511 MeV emitted from the graphite rod is measured with a semiconductor detector. As a control sample, the liquid target (1 ml) is irradiated with the proton beam, applied on an aluminum foil, dried, and then measured on the intensity of the gamma ray of 0.511 MeV emitted from the control sample in the same manner. The measured value for the graphite rod is compared with that for the control sample to determine the binding efficiency relatively.

Figure 4:
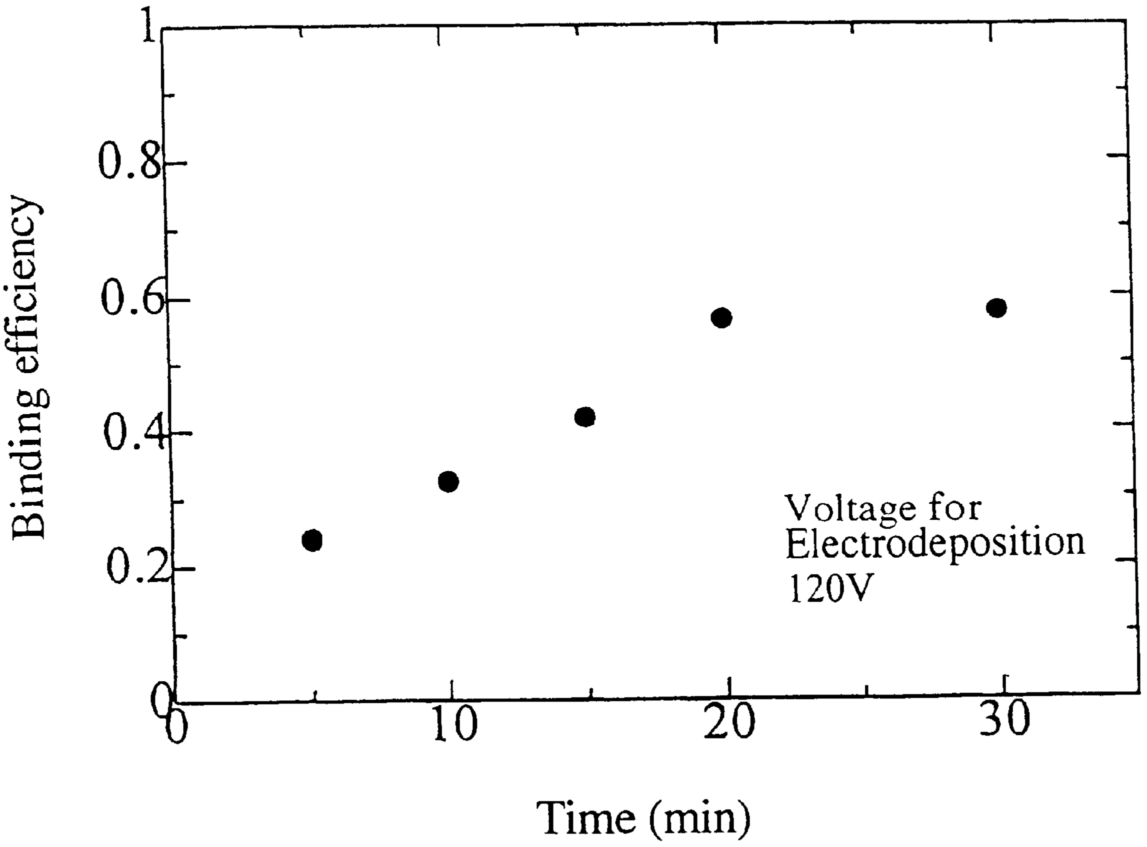
FIG. 4 is a graphical representation showing the time course of the bonding efficiency of $^{18}F$.

Referring to FIG. 4, there is a graph illustrating the time course of the binding efficiency of $^{18}F$ onto a 3 mmφ graphite rod at the electrodeposition voltage of 120V, in which the time for passing the electric current is plotted as abscissa and the binding efficiency as ordinate. As shown in FIG. 4, it is found that the binding efficiency of 50% or higher can be achieved by passing electric current for 20 minutes or 30 minutes.

In the examination, graphite rods of 3 mm and 5 mm in diameter are used. However, other carbon materials having excellent conductivity and satisfactory material strength (e.g., glassy carbon) may also give the similar results. Although the diameters of the carbon member used in the tests is 3 mm and 5 mm, diameters of less than 3 mm (e.g., less than 1 mm) may also be employed. It will be obvious that the cross section of the carbon member is not particularly limited, such as a square, hexagonal or circular shape.

Figure 5:
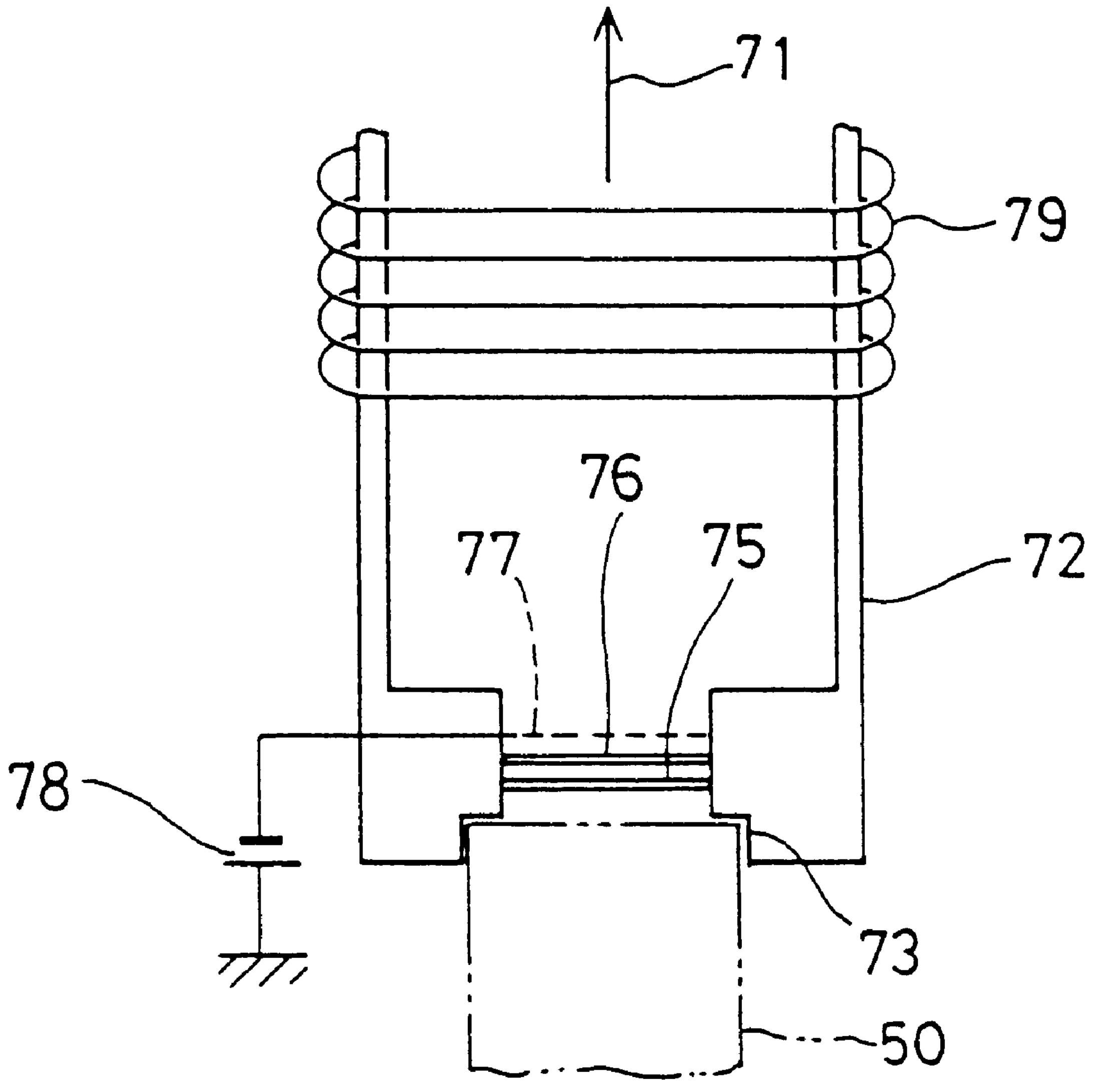
FIG. 5 is a schematic sectional view of an embodiment of a slow positron beam-generating unit with a positron source in accordance with the present invention.

Referring to FIG. 5, there is a sectional view of an embodiment of a slow positron beam-generating unit with the positron source according to the present invention. One end of a vacuum container 72 with a step 73 is double sealed with a reinforcing titanium foil 75 and a moderator 76, in the front of which a grid 77 is provided. The grid 77 is applied with a voltage of about --30V from a power supply 78. The moderator 76 is composed of a tungsten foil of about 10 $\mu$m thick. A positron source 50 with a positron emitter $^{18}$F bonded onto its one end is engaged in the step 73 of the vacuum container 72 with so that the positron source 50 is aligned in the right place against the moderator 76.

The positron emitted from the positron emitter present at the end surface of the positron source 50 is ejected to the vacuum container 72 through the titanium foil 75. Then, the positron enters the moderator 76 to be slowed down. The slowed positron is then accelerated through the electric field generated by the grid 77 and transferred to a place where the positron beam is to be used as a slow positron beam 71 along the magnetic field generated by a coil 79.

Figure 6:
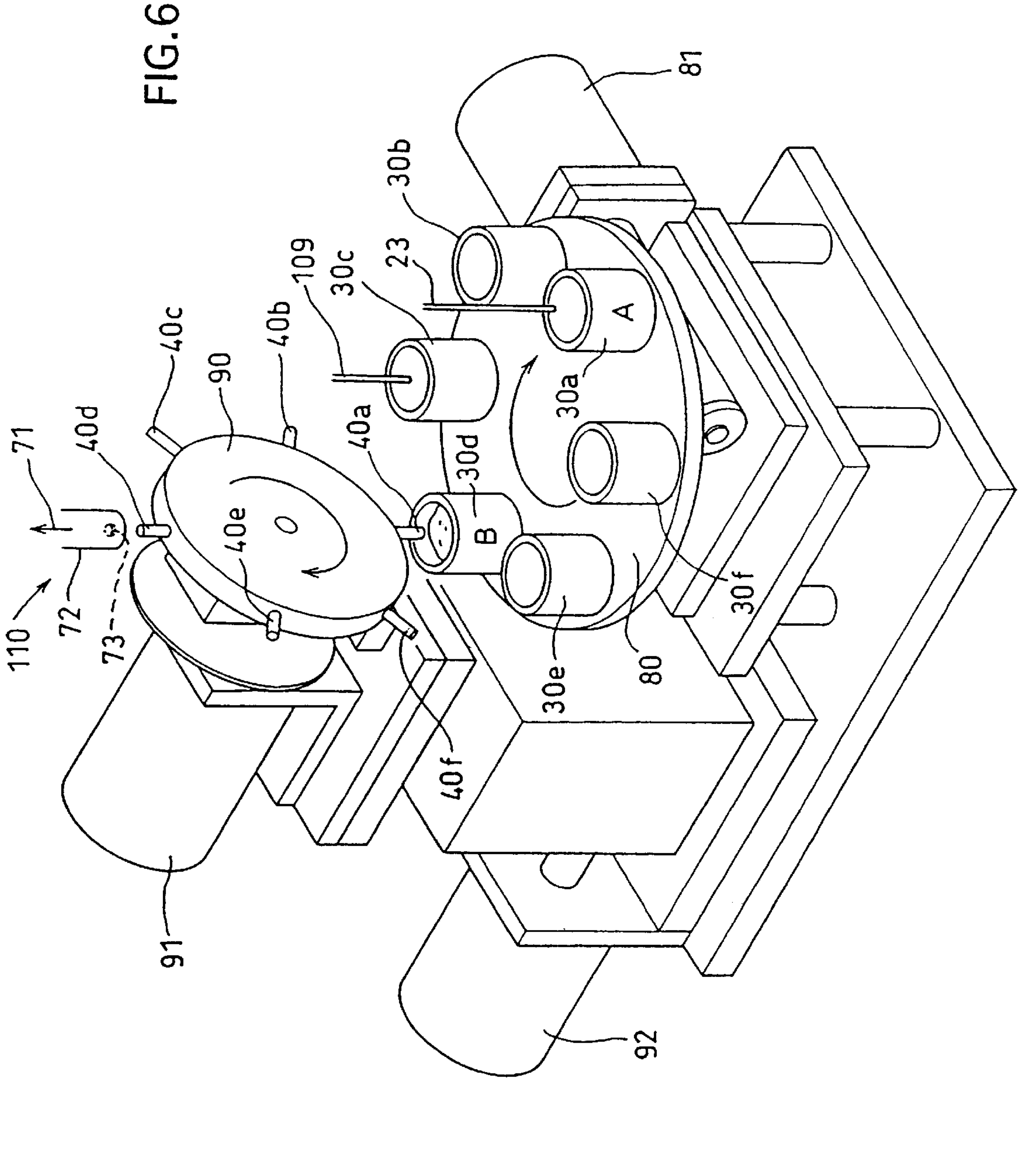
FIG. 6 is a schematic illustration of an embodiment of an automated system for supplying a positron source in accordance with the present invention.
Figure 7:
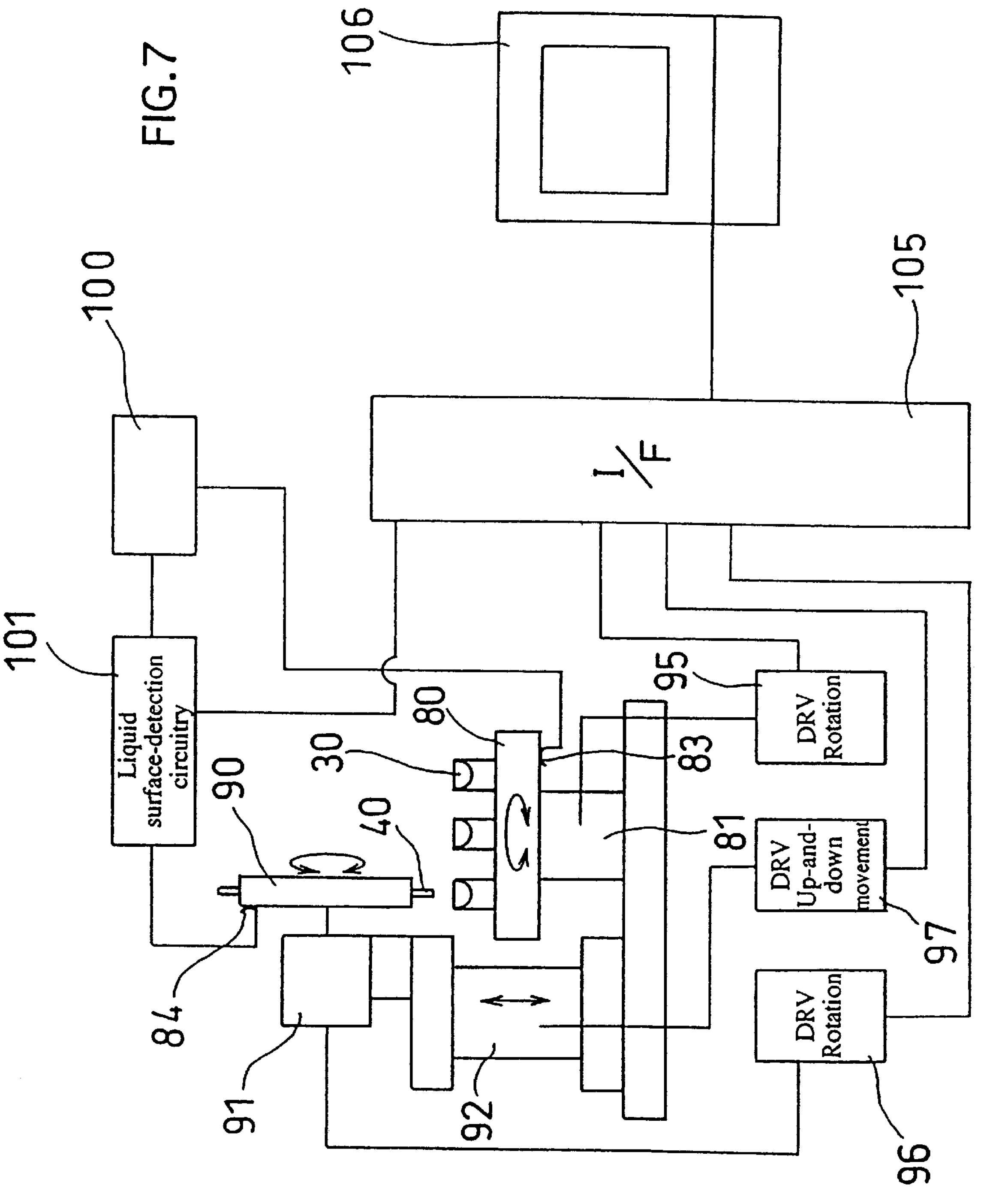
FIG. 7 is a connection diagram illustrating a general set-up for driving an automated system for supplying a positron source in accordance with the present invention.

Referring to FIGS. 6 and 7, there are a schematic illustration of an embodiment of an automated system for supplying a positron source according to the present invention, and a connection diagram illustrating a general set-up for driving the system. The automated system for supplying a positron source comprises a rotary table 80 on which a plurality of containers 30*a*–30*f* are mounted, and a rotary member 90 to which the same numbers of carbon members 40*a*–40*f* as that of the containers are removably mounted. Each of the containers 30*a*–30*f* is manufactured by forming a semispherical cavity on a copper block and plating the inner surface of the cavity with rhodium. The rotary table 80 is capable of rotating in a 360-degree arc by the aid of a pulse motor 81. The rotary member 90 is capable of rotating in a 360-degree arc by the aid of a pulse motor 91. The rotary member 90 is also capable of up-and-down movement by the aid of a pulse motor 92.

The pulse motors 81, 91 and 92 are driven by motor drivers 95, 96 and 97, respectively, that are controlled by a computer 106 through an interface 105. The constant-voltage power supply 100 is connected to the rotary plate 80 (negative side) and the rotary member 90 (positive side) through phospher bronze-made brushes 83 and 84, respectively. Between the power supply 100 and the rotary member 90A is provided a liquid surface-detection circuitry 101. The output of the liquid surface-detection circuitry 101 is input into the computer 106 through the interface 105.

In the apparatus, there are determined Position A where the solution is supplied to the container and Position B where electric current is passed through the solution. At Position A, a solution containing a positron emitter $^{18}$F is supplied into a container 30a from a positron emitter-generating unit as shown in FIG. 1 through a liquid target feed pipe 23. After the supply of the $^{18}$F-containing solution into the container 30a is completed, the pulse motor 81 is driven to rotate the rotary table 80, so that the container 30*a* moves to Position B which is positioned underneath the carbon member 40*a* mounted on the rotary member 90.

Next, the pulse motor 92 is driven to move down the rotary member 90 slowly. Then, the carbon member 40*a* mounted on the rotary member 90 also moves down slowly toward the solution in the container 30a. When the carbon member 40*a* (at a positive potential) contacts with the liquid surface of the solution in the container 30*a* (at a negative potential), an electricity of about a few mA flows. The liquid surface-detection circuitry 101 detects the generated a micro-current by a photocoupler and sends it as a liquid surface-detection signal to the computer 106 through a ultra-compact relay. When the computer 106 receives the signal, it operates a driver 97 so that the carbon member 40a further moves down by about 0.1 mm. Thereafter, an electric current is passed through the liquid with the constant-voltage power supply 100 at 90V for 20 minutes to cause to bind the positron emitter $^{18}$F onto one end of the carbon member 40*a*. Thus, a positron source can be prepared.

Once the positron source is prepared, the pulse motor 92 is driven to elevate the rotary member 90 upward, whereby the positron source (carbon member 40*a*) is also moved upward of the container 30*a*. The pulse motor 91 is also driven to move the carbon member 40*a* to the position opposed to the positron source-receiving section (step) 73 of the positron beam-generating unit. Thereafter, the pulse motor 92 is driven to move the rotary member 90 upward by a predetermined distance, so that the carbon member 40*a* is attached to the positron source-receiving section (step) 73 of the positron beam-generating unit. Using this sequence of operations, a slow positron beam 71 can be generated from the positron beam-generating unit. The sequence of operations is performed automatically under computer control.

The half-life of the positron emitter $^{18}$F is about 110 minutes. Therefore, the positron source (i.e., carbon member 40*a*) can generate a positron beam for about two hours. When the intensity of the positron beam 71 is decreased, a solution which contains a positron emitter $^{18}$F prepared as described above in the positron emitter-generating unit as shown in FIG. 1 is supplied to a next container 30*b* on the rotary table 80 through the liquid target feed pipe 23. Then, the positron emitter $^{18}$F in the container 30*b* is bound onto a carbon member 40*b* and supplied to the positron beam-generating unit 110. By these operations, for instance, a 20 minute passage of electric current at Position B and a subsequent two hour positron beam generation can be performed repeatedly. In this case, for instance, if the system is provided with six containers 30 and six carbon members 40, a continuous running for 12 hours becomes possible, and if the system is provided with 12 containers 30 and 12 carbon members 40, a continuous running for 24 hours becomes possible. The solution after the passage of electric current is recovered through a recovery pipe 109.

As stated above, according to the present invention, a positron source capable of generating positrons of high intense efficiently from a small surface area which is almost a point source, can be prepared. Using the system of the present invention as described above, the positron source can be supplied to a positron beam-generating unit automatically.

The invention has been described in detail with reference to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. An automated system for providing a source of positrons comprising:

means for moving a container with a solution containing $^{18}F$ to the position where an electric current is to be passed through the solution;

means for passing an electric current through the solution at that position using a carbon member as an anode, to prepare a positron source; and means for transferring the carbon member after the passage of the electric current to a positron beam-generating unit.

2. An automated system for providing a source of positrons comprising:

a rotary table for rotating a container mounted thereon;

means for supplying a solution containing $^{18}F$ into the container;

first drive means for rotationally driving the rotary table so that the container moves between the position where the solution is to be supplied into the container and the position where an electric current is to be passed through the solution in the container;

a rotary member on which a carbon member is mounted;

second drive means for rotationally driving the rotary member so that the carbon member moves between the position opposed to the liquid surface of the solution in the container placed in the position where an electric current is to be passed to the solution and the position opposed to a positron source-receiving section of a positron beam-generating unit;

hoisting-and-lowering means for moving the rotary member up and down; and a power supply for passing an electric current through the solution in the container using the carbon member as an anode, to prepare a positron source;

wherein the carbon member onto the surface of which $^{18}F$ is caused to bind by passing an electric current through the solution in the container using the carbon member as an anode, is attached to the positron source-receiving section of the positron beam-generating unit.

3. The automated system for providing a source of positrons of claim 2, further comprising contact-detection means for detecting the contact of the carbon member with solution in the container.

4. The automated system for providing a source of positrons of claim 2, wherein a plurality of containers are mounted on the rotary table and the same numbers of carbon members as that of the containers are mounted on the rotary member.

5. The automated system for providing a source of positrons of claim 3, wherein a plurality of containers are mounted on the rotary table and the same numbers of carbon members as that of the containers are mounted on the rotary member.

* * * * *